United States Patent
Sapiens et al.

(10) Patent No.: US 10,690,602 B2
(45) Date of Patent: Jun. 23, 2020

(54) METHODS AND SYSTEMS FOR MEASUREMENT OF THICK FILMS AND HIGH ASPECT RATIO STRUCTURES

(71) Applicant: KLA-Tencor Corporation, Milpitas, CA (US)

(72) Inventors: Noam Sapiens, Cupertino, CA (US); Shankar Krishnan, Santa Clara, CA (US); David Y. Wang, Santa Clara, CA (US); Alexander Buettner, Weilburg (DE); Kerstin Purrucker, Fliederweg (DE); Kevin A. Peterlinz, San Ramon, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 54 days.

(21) Appl. No.: 15/896,978

(22) Filed: Feb. 14, 2018

(65) Prior Publication Data

US 2018/0238814 A1    Aug. 23, 2018

Related U.S. Application Data

(60) Provisional application No. 62/460,668, filed on Feb. 17, 2017.

(51) Int. Cl.
*G01N 21/95* (2006.01)
*G01B 11/06* (2006.01)
(Continued)

(52) U.S. Cl.
CPC ....... *G01N 21/9501* (2013.01); *G01B 11/065* (2013.01); *G01B 11/0625* (2013.01);
(Continued)

(58) Field of Classification Search
CPC ................................. G01N 21/9501
(Continued)

(56) References Cited

U.S. PATENT DOCUMENTS 5,166,752 A    11/1992  Spanier et al.
5,608,526 A    3/1997   Piwonka-Corle et al.
(Continued)

FOREIGN PATENT DOCUMENTS

WO    2007004177 A2    1/2007

OTHER PUBLICATIONS

International Search Report dated May 25, 2018, for PCT Application No. PCT/US2018/018457 filed on Feb. 16, 2018 by KLA-Tencor Corporation, 3 pages.
(Continued)

*Primary Examiner* — Tarifur R Chowdhury
*Assistant Examiner* — Omar H Nixon
(74) *Attorney, Agent, or Firm* — Spano Law Group; Joseph S. Spano

(57) ABSTRACT

Methods and systems for performing spectroscopic measurements of semiconductor structures including ultraviolet, visible, and infrared wavelengths greater than two micrometers are presented herein. A spectroscopic measurement system includes a combined illumination source including a first illumination source that generates ultraviolet, visible, and near infrared wavelengths (wavelengths less than two micrometers) and a second illumination source that generates mid infrared and long infrared wavelengths (wavelengths of two micrometers and greater). Furthermore, the spectroscopic measurement system includes one or more measurement channels spanning the range of illumination wavelengths employed to perform measurements of semiconductor structures. In some embodiments, the one or more measurement channels simultaneously measure the sample
(Continued)

throughout the wavelength range. In some other embodiments, the one or more measurement channels sequentially measure the sample throughout the wavelength range.

22 Claims, 11 Drawing Sheets

(51) Int. Cl.

| | | |
|---|---|---|
| G01J 3/42 | (2006.01) | |
| G01N 21/956 | (2006.01) | |
| H01L 21/66 | (2006.01) | |
| G01J 3/02 | (2006.01) | |
| G01J 3/36 | (2006.01) | |
| G01J 3/10 | (2006.01) | |
| G01J 3/28 | (2006.01) | |
| G01N 21/84 | (2006.01) | |
| G01N 21/21 | (2006.01) | |

(52) U.S. Cl.
CPC ...... *G01B 11/0633* (2013.01); *G01B 11/0641* (2013.01); *G01J 3/0224* (2013.01); *G01J 3/10* (2013.01); *G01J 3/2803* (2013.01); *G01J 3/36* (2013.01); *G01J 3/42* (2013.01); *G01N 21/956* (2013.01); *G01N 21/95607* (2013.01); *H01L 22/12* (2013.01); *G01B 2210/56* (2013.01); *G01N 21/211* (2013.01); *G01N 2021/8438* (2013.01); *G01N 2021/95676* (2013.01)

(58) Field of Classification Search
USPC ........................................... 356/320
See application file for complete search history.

(56) References Cited

U.S. PATENT DOCUMENTS

| | | | |
|---|---|---|---|
| 5,808,738 A | 9/1998 | Garcia-Rubio | |
| 5,859,424 A | 1/1999 | Norton et al. | |
| 6,429,943 B1 | 8/2002 | Opsal et al. | |
| 6,633,831 B2 | 10/2003 | Nikoonahad et al. | |
| 6,734,967 B1 | 5/2004 | Piwonka-Corle et al. | |
| 6,816,570 B2 | 10/2004 | Janik et al. | |
| 6,859,278 B1 | 2/2005 | Johs et al. | |
| 6,895,075 B2 | 5/2005 | Yokhin et al. | |
| 6,972,852 B2 | 12/2005 | Opsal et al. | |
| 7,478,019 B2 | 1/2009 | Zangooie et al. | |
| 7,755,764 B2 | 7/2010 | Kwak et al. | |
| 7,826,071 B2 | 11/2010 | Shchegrov et al. | |
| 7,907,264 B1 | 3/2011 | Krishnan | |
| 7,929,667 B1 | 4/2011 | Zhuang et al. | |
| 7,933,026 B2 | 4/2011 | Opsal et al. | |
| 8,860,937 B1 | 10/2014 | Dziura et al. | |
| 9,291,554 B2 | 3/2016 | Kuznetsov et al. | |
| 9,310,290 B2 | 4/2016 | Wang et al. | |
| 2002/0109110 A1 | 8/2002 | Some | |
| 2003/0206292 A1 | 11/2003 | Some | |
| 2006/0289790 A1 | 12/2006 | Raymond et al. | |
| 2007/0274650 A1* | 11/2007 | Tearney | A61B 1/00082 385/118 |
| 2008/0088821 A1* | 4/2008 | Hurvitz | G01N 21/0332 356/51 |
| 2009/0279090 A1 | 11/2009 | Wolf et al. | |
| 2010/0118300 A1 | 5/2010 | Wang | |
| 2012/0250032 A1 | 10/2012 | Wilde et al. | |
| 2012/0257213 A1 | 10/2012 | Schnleber | |
| 2013/0114085 A1 | 5/2013 | Wang et al. | |
| 2013/0222795 A1 | 8/2013 | Madsen et al. | |
| 2013/0342105 A1* | 12/2013 | Shchemelinin | H01J 37/32055 315/111.21 |
| 2013/0342673 A1 | 12/2013 | Sticker et al. | |
| 2014/0111791 A1 | 4/2014 | Manassen et al. | |
| 2014/0166862 A1 | 6/2014 | Flock | |
| 2014/0168417 A1* | 6/2014 | Hsieh | G01N 21/8806 348/125 |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2014/0316730 A1 | 10/2014 | Shchegrov et al. | |
| 2014/0375983 A1 | 12/2014 | Wolf et al. | |
| 2015/0042984 A1 | 2/2015 | Pandev et al. | |
| 2015/0046118 A1 | 2/2015 | Pandev et al. | |
| 2015/0193926 A1 | 7/2015 | Berlatzky et al. | |
| 2015/0204664 A1 | 7/2015 | Bringoltz et al. | |
| 2016/0117847 A1 | 4/2016 | Pandev | |
| 2016/0139032 A1 | 5/2016 | Rampoldi et al. | |
| 2016/0161245 A1 | 6/2016 | Fu et al. | |
| 2016/0238378 A1 | 8/2016 | Marx | |
| 2016/0381776 A1 | 12/2016 | Derstine | |
| 2017/0024509 A1* | 1/2017 | Hu | G06F 17/5081 |

OTHER PUBLICATIONS

Gostein et al., "Measuring deep-trench structures with model-based IR," Solid State Technology, vol. 49, No. 3, pp. 38-42, Mar. 1, 2006.

* cited by examiner

METHODS AND SYSTEMS FOR MEASUREMENT OF THICK FILMS AND HIGH ASPECT RATIO STRUCTURES

CROSS REFERENCE TO RELATED APPLICATION

The present application for patent claims priority under 35 U.S.C. § 119 from U.S. provisional patent application Ser. No. 62/460,668, filed Feb. 17, 2017, the subject matter of which is incorporated herein by reference in its entirety.

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition, overlay and other parameters of nanoscale structures.

Flash memory architectures are transitioning from two dimensional floating-gate architectures to fully three dimensional geometries. In some examples, film stacks and etched structures are very deep (e.g., up to six micrometers in depth). Such high aspect ratio structures create challenges for film and CD measurements. The ability to measure the critical dimensions that define the shapes of holes and trenches of these structures is critical to achieve desired performance levels and device yield. In addition, many semiconductor architectures employ thick, opaque material layers such as amorphous-carbon layers, tungsten layers, and hard mask layers. Illumination light in the vacuum ultraviolet, ultraviolet, visible, and short infrared wavelength ranges (i.e., wavelengths below approximately 1 micrometer) do not sufficiently penetrate these opaque layers, resulting in measurement signals with low signal to noise ratio or no measureable signal at all.

Many optical techniques suffer from low signal-to-noise ratios (SNRs), as only a small fraction of the illumination light is able to reach the bottom of high aspect ratio features, and reflect upwards to the detector. Thus, many available high-throughput metrology techniques are unable to reliably perform CD and film measurements of high aspect ratio structures. Critical dimension, small angle X-ray scatterometry (CD-SAXS), normal incidence reflectometry, and scatterometry are being explored as measurement solutions for high aspect ratio structures, but development is still ongoing.

Cross-sectional scanning electron microscopy (SEM) is a low throughput, destructive technique that is not suitable for inline metrology. Atomic force microscopy (AFM) is limited in its ability to measure high aspect ratio structures and has relatively low throughput. CD-SAXS has not yet been demonstrated to achieve high throughput capabilities required by the semiconductor industry. Model based infrared reflectometry (MBIR) has been used for metrology of high aspect ratio DRAM structures, but the technique lacks the resolution provided by shorter wavelengths and the measurement spot sizes are too large for semiconductor metrology. See "Measuring deep-trench structures with model-based IR," by Gostein et al., Solid State Technology, vol. 49, no. 3, Mar. 1, 2006, which is incorporated by reference as if fully set forth herein.

Optical CD metrology currently lacks the ability to measure the detailed profile of structures with micron scale depths and lateral dimensions in a relatively small spot (e.g., less than 50 microns, or even more preferably, less than 30 microns) at high throughput. U.S. Pat. No. 8,860,937, which is incorporated by reference as if fully set forth herein, describes infrared spectroscopic ellipsometry techniques that are suitable for characterization of high aspect ratio structures. However, the described techniques suffer from long measurement times for measurements spanning the ultraviolet and infrared wavelengths, wavelength stability limitations, and limited range of infrared wavelengths during operation.

In summary, ongoing reductions in feature size, increasing depths of structural features, and increasing use of opaque material layers impose difficult requirements on optical metrology systems. Optical metrology systems must meet high precision and accuracy requirements for increasingly complex targets at high throughput to remain cost effective. In this context, speed of broadband illumination and data collection, and range of infrared wavelengths have emerged as critical, performance limiting issues in the design of optical metrology systems suitable for high aspect ratio structures and structures employing opaque material layers. Thus, improved metrology systems and methods to overcome these limitations are desired.

SUMMARY

Methods and systems for performing spectroscopic measurements of semiconductor structures including infrared wavelengths are presented herein. In some embodiments, spectra including ultraviolet, visible, and infrared wavelengths, including infrared wavelengths greater than two micrometers, are measured at high throughput with the same alignment conditions. In this manner, time dependent system errors, such as hardware drifts and wafer transients, can be uniformly corrected across all measured wavelengths.

By measuring a target with infrared, visible, and ultraviolet light in a single system, precise characterization of complex three dimensional structures is enabled. In general, relatively long wavelengths penetrate deep into a structure and provide suppression of high diffraction orders when measuring structures with relatively large pitch. Relatively short wavelengths provide precise dimensional information about structures accessible to relatively short wavelengths (i.e., top level layers) as well as relatively small CD and roughness features. In general, measuring a target with infrared, visible, and ultraviolet light in a single system improves sensitivity to some measurement parameters and reduces correlations among parameters (e.g., parameters characterizing top and bottom layers).

In one aspect a spectroscopic measurement system includes a combined illumination source including a first illumination source that generates ultraviolet, visible, and near infrared wavelengths (e.g., wavelengths less than two micrometers) and a second illumination source that generates mid infrared and long infrared wavelengths (e.g., wavelengths of two micrometers and greater). In some examples, the combined illumination source generates illumination light having wavelengths up to and including 4.2 micrometers. In some examples, the combined illumination source generates illumination light having wavelengths up to and including 5 micrometers. In some examples, the combined illumination source generates illumination light having wavelengths that exceed 5 micrometers. Furthermore, the spectroscopic measurement system includes one or more measurement channels spanning the range of illumination wavelengths employed to perform measurements of semiconductor structures. The one or more measurement channels are operable in parallel (i.e., simultaneous measurement of the sample throughout the wavelength range) or in sequence (i.e., sequential measurement of the sample throughout the wavelength range).

In some embodiments, the detector subsystem includes two or more detectors each configured to detect collected light over different wavelength ranges, including infrared, simultaneously.

In a further aspect, spectroscopic measurements are performed off-axis from the direction normal to the surface of the wafer to reduce the influence of backside reflections on the measurement results.

In another further aspect, a broad range of wavelengths are detected by a detector that includes multiple photosensitive areas having different sensitivity characteristics. In some embodiments, multiple sensor chips, each sensitive in a different waveband are combined into a single detector package.

In another further aspect, the dimensions of the illumination field stop projected on wafer plane are adjusted to optimize the resulting measurement accuracy and speed based on the nature of target under measurement.

In another further aspect, the dimensions of the illumination field stop are adjusted to achieve the desired spectral resolution for each measurement application.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for performing spectroscopic measurements of semiconductor structures including infrared wavelengths are presented herein. In some embodiments, spectra including ultraviolet, visible, and infrared wavelengths, including infrared wavelengths greater than two micrometers, are measured at high throughput with the same alignment conditions. In this manner, time dependent system errors, such as hardware drifts and wafer transients, can be uniformly corrected across all measured wavelengths.

By measuring a target with infrared, visible, and ultraviolet light in a single system, precise characterization of complex three dimensional structures is enabled. In general, relatively long wavelengths penetrate deep into a structure and provide suppression of high diffraction orders when measuring structures with relatively large pitch. Relatively short wavelengths provide precise dimensional information about structures accessible to relatively short wavelengths (i.e., top level layers) as well as relatively small CD and roughness features. In some examples, longer wavelengths enable measurement of dimensional characteristics of targets with relatively rough surfaces or interfaces due to lower sensitivity of longer wavelengths to roughness. In general, measuring a target with infrared, visible, and ultraviolet light in a single system improves sensitivity to some measurement parameters and reduces correlations among parameters (e.g., parameters characterizing top and bottom layers).

In some embodiments, the methods and systems for spectroscopic metrology of semiconductor devices described herein are applied to the measurement of high aspect ratio (HAR), large lateral dimension structures, opaque film layers, or a combination thereof. These embodiments enable optical critical dimension (CD), film, and composition metrology for semiconductor devices with HAR structures (e.g., NAND, VNAND, TCAT, DRAM, etc.) and, more generally, for complex devices that suffer from low light penetration into the structure(s) being measured. HAR structures often include hard mask layers to facilitate etch processes for HARs. As described herein, the term "HAR structure" refers to any structure characterized by an aspect ratio that exceeds 2:1 or 10:1, and may be as high as 100:1, or higher.

Figure 1:
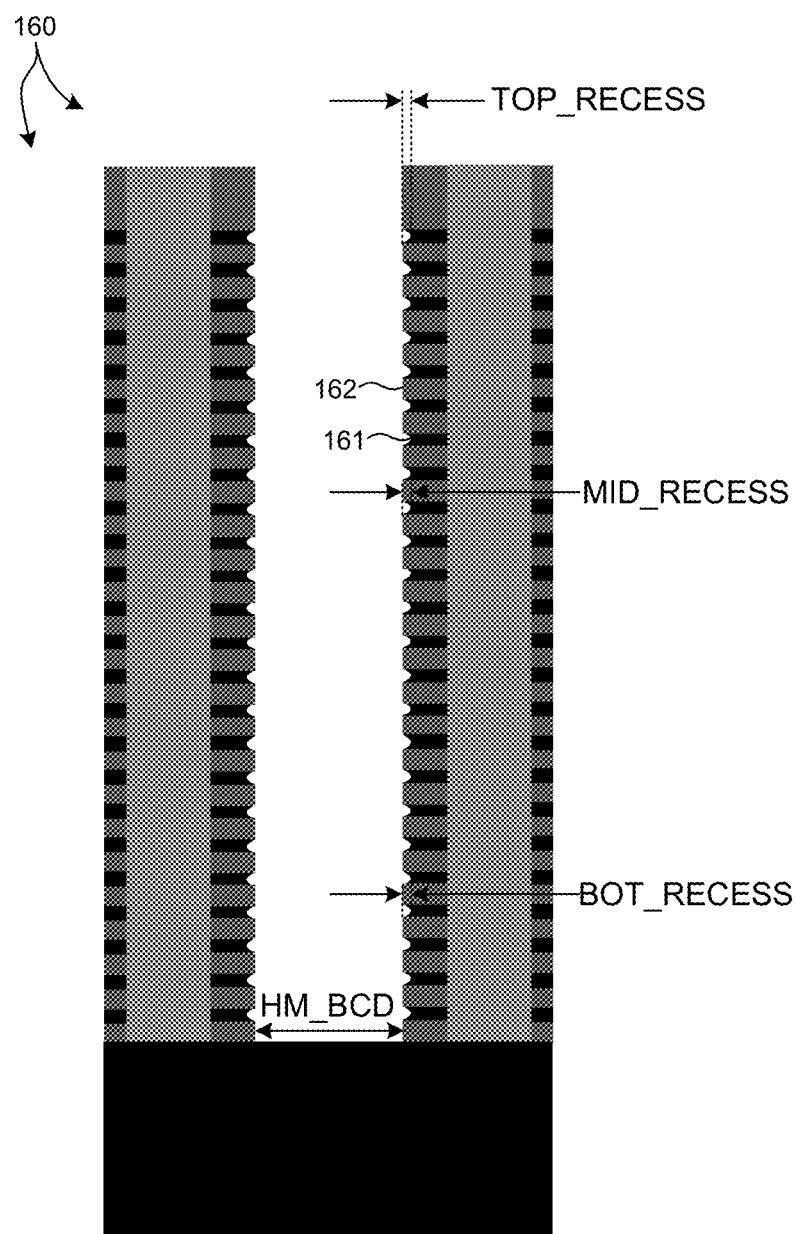
FIG. 1 depicts an exemplary high aspect ratio semiconductor structure 160 that suffers from low light penetration into the structure(s) being measured.

FIG. 1 depicts a vertically integrated memory structure 160 including tungsten layers 161 sandwiched between oxide layers 162. As depicted in FIG. 1, the etching process leaves behind a horizontal recess in each tungsten layer 161 relative to oxide layers 162 above and below each tungsten layer 161. The tungsten recess at or near the top of structure 160 is referred to as a top_recess. The tungsten recess at or near the middle of structure 160 is referred to as a mid_recess. The tungsten recess at or near the bottom of structure 160 is referred to as a bot_recess. The opening of the oxide layer 162 at or near the bottom of structure 160 is referred to as the bottom critical dimension (HM_BCD).

Figure 2:
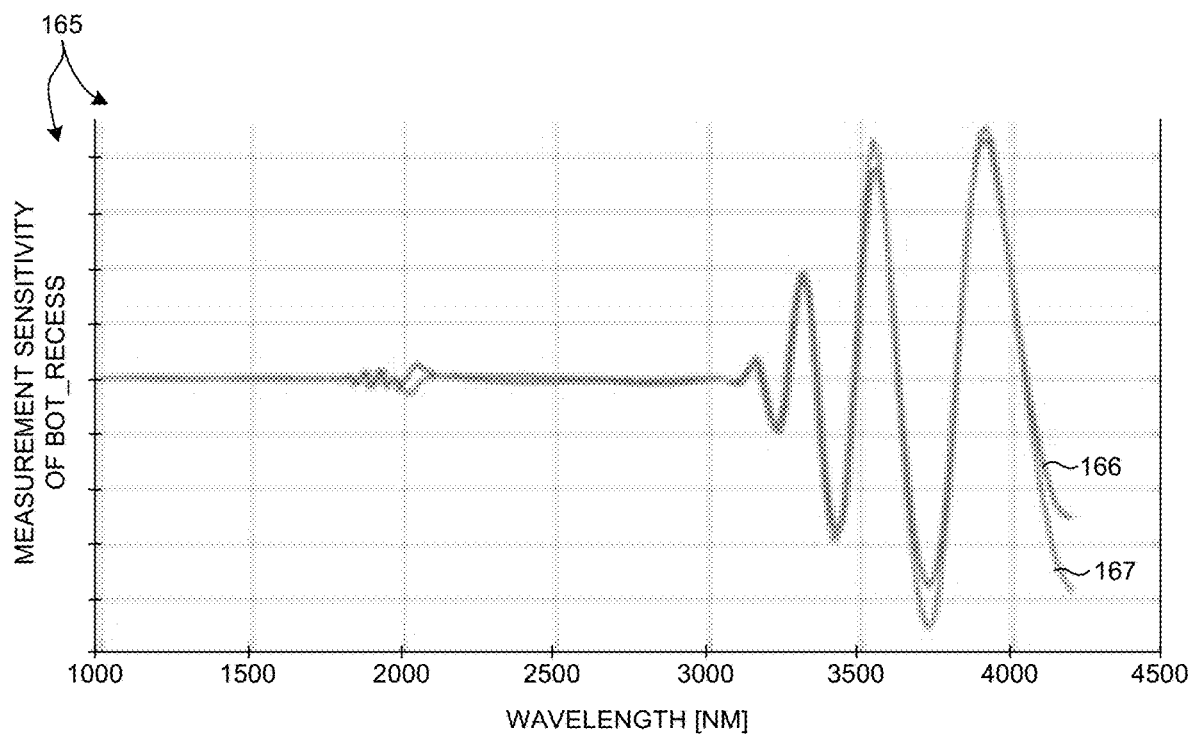
FIG. 2 depicts a plot of measurement sensitivity associated with a measurement of the bot_recess dimension depicted in FIG. 1 as a function of measurement wavelength.

FIG. 2 depicts a plot 165 of measurement sensitivity associated with a measurement of the bot_recess dimension depicted in FIG. 1 as a function of measurement wavelength. As depicted in FIG. 2, spectroscopic signals 166 and 167 exhibit practically no sensitivity to the bot_recess dimension for illumination wavelengths below three micrometers. However, for illumination wavelengths above three micrometers up to 4.2 micrometers, both spectroscopic signals 166 and 167 exhibit substantial measurement sensitivity to the bot_recess dimension.

Figure 3:
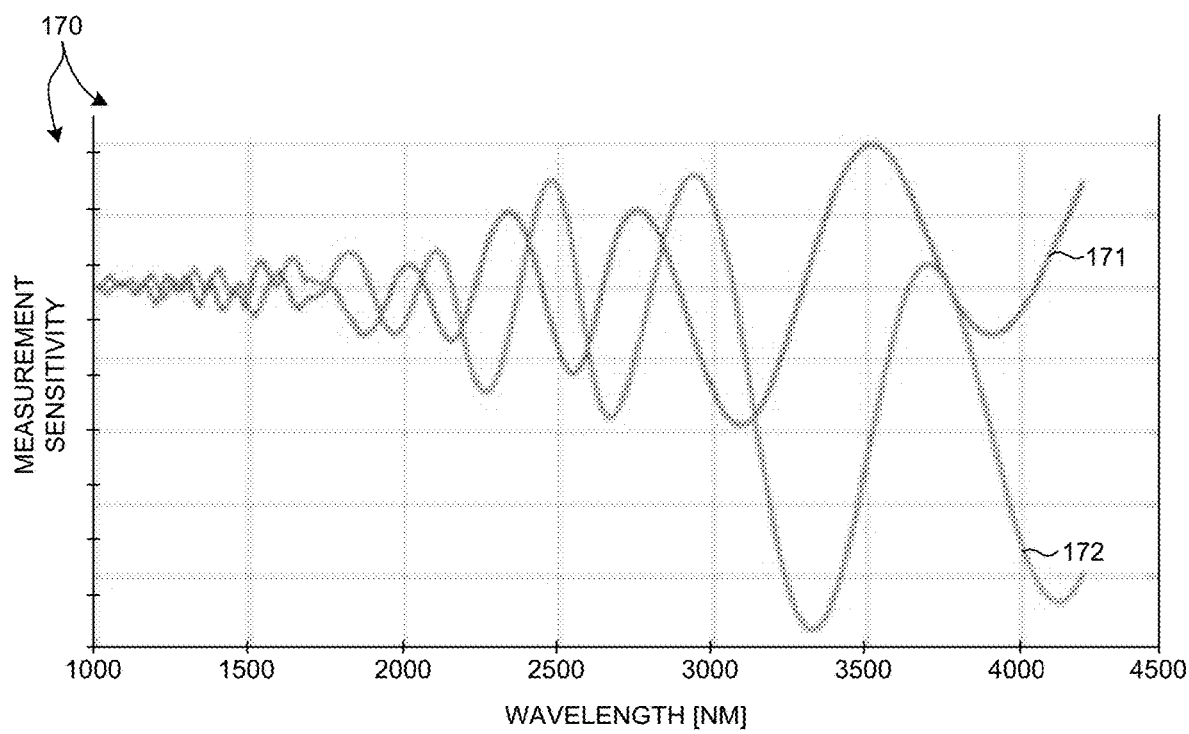
FIG. 3 depicts a plot of measurement sensitivity associated with a measurement of the HM_BCD dimension depicted in FIG. 1 as a function of measurement wavelength.

FIG. 3 depicts a plot 170 of measurement sensitivity associated with a measurement of the HM_BCD dimension depicted in FIG. 1 as a function of measurement wavelength. As depicted in FIG. 3, spectroscopic signals 171 and 172 exhibit increasing sensitivity to the HM_BCD dimension for illumination wavelengths above approximately 2 micrometers. For illumination wavelengths above three micrometers up to 4.2 micrometers, both spectroscopic signals 171 and 172 exhibit substantial measurement sensitivity to the HM_BCD dimension.

Figure 4:
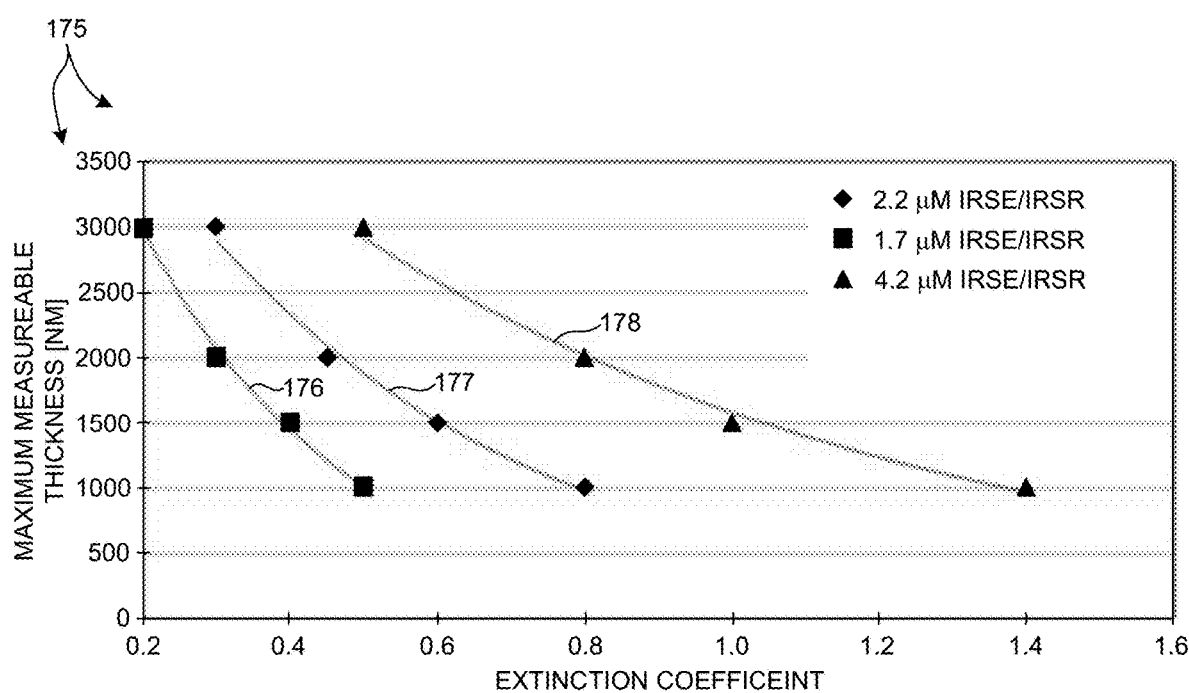
FIG. 4 depicts a plot of measurements of amorphous carbon layer of varying thicknesses and extinction coefficients employing infrared illumination light having wavelengths of 1.7, 2.2, and 4.2 micrometers.

FIG. 4 depicts a plot 175 of measurements of amorphous carbon layer of varying thicknesses and extinction coefficients employing infrared illumination light having wavelengths of 1.7, 2.2, and 4.2 micrometers. As depicted in FIG. 4, in general, the larger the extinction coefficient of the amorphous carbon layer, the smaller the measureable layer thickness. Plotline 176 illustrates the tradeoff between maximum achievable measurement thicknesses as a function of extinction coefficient for measurements employing illumination at 1.7 micrometers. Plotline 177 illustrates the tradeoff between maximum achievable measurement thicknesses as a function of extinction coefficient for measurements employing illumination at 2.2 micrometers. Plotline 178 illustrates the tradeoff between maximum achievable measurement thicknesses as a function of extinction coefficient for measurements employing illumination at 4.2 micrometers. As depicted in FIG. 4, longer wavelength illumination (e.g., 4.2 micrometer wavelength) enables measurement of thick films with larger extinction ratios compared to shorter illumination wavelengths.

As illustrated in FIGS. 1-4, long wavelength infrared illumination (e.g., greater than two micrometers, up to approximately five micrometers) enables measurement of thick, opaque hardmask films such as amorphous carbon layers. Long wavelength infrared illumination also enables the measurement of critical dimensions (CD) at the bottom of deep holes and trenches in high-aspect ratio structures such as 3D NAND and DRAM capacitor structures. In addition, long wavelength infrared illumination enables the measurement of ultra-shallow junctions and implant monitoring for Boron, etc.

In one aspect a spectroscopic measurement system includes a combined illumination source including a first illumination source that generates ultraviolet, visible, and near infrared wavelengths (e.g., wavelengths less than two micrometers) and a second illumination source that generates mid infrared and long infrared wavelengths (e.g., wavelengths of two micrometers and greater). In some examples, the combined illumination source generates illumination light having wavelengths up to and including 4.2 micrometers. In some examples, the combined illumination source generates illumination light having wavelengths up to and including 5 micrometers. In some examples, the combined illumination source generates illumination light having wavelengths that exceed 5 micrometers. Furthermore, the spectroscopic measurement system includes one or more measurement channels spanning the range of illumination wavelengths employed to perform measurements of semiconductor structures. The one or more measurement channels are operable in parallel (i.e., simultaneous measurement of the sample throughout the wavelength range) or in sequence (i.e., sequential measurement of the sample throughout the wavelength range).

Figure 5:
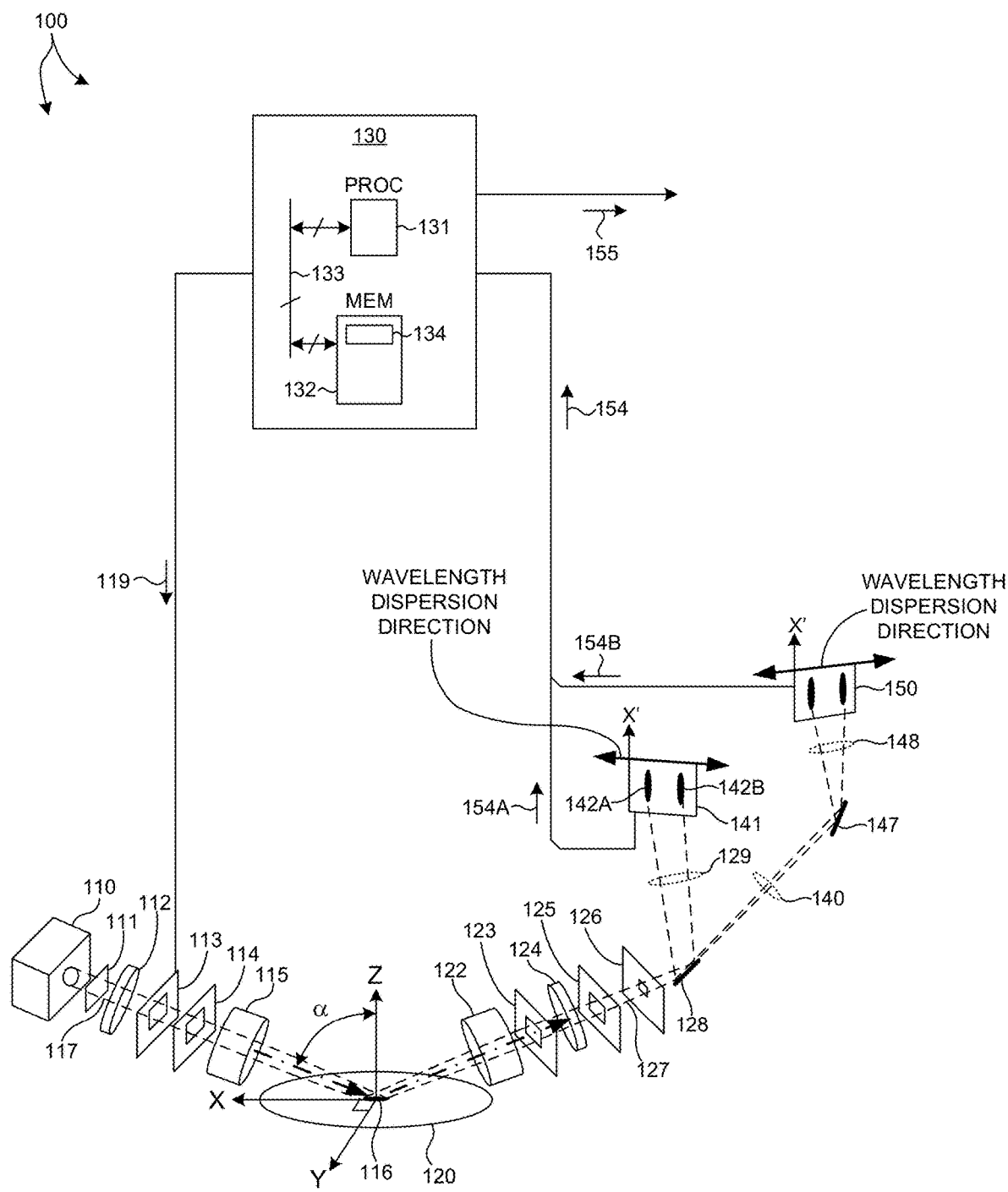
FIG. 5 depicts an exemplary metrology system 100 for performing broadband spectroscopic measurements of semiconductor structures using a combined illumination source as described herein.

FIG. 5 depicts an exemplary, metrology system 100 for performing broadband infrared spectroscopic measurements of semiconductor structures (e.g., film thickness, critical dimensions, overlay, etc.). In some examples, the one or more structures include at least one high aspect ratio (HAR) structure or at least one large lateral dimension structure. As depicted in FIG. 5, metrology system 100 is configured as an oblique incidence, broadband spectroscopic reflectometer. However, in general, metrology system 100 may also include additional spectroscopic reflectometers, a spectroscopic ellipsometer, scatterometer, or any combination thereof.

Metrology system 100 includes an illumination source 110 that generates a beam of illumination light 117 incident on a wafer 120. In some embodiments, illumination source 110 is a combined illumination source that emits illumination light in the ultraviolet, visible, and infrared spectra, including infrared wavelengths greater than two micrometers.

In a preferred embodiment, combined illumination source 110 includes a supercontinuum laser source and a laser sustained plasma light source. The supercontinuum laser source provides illumination at wavelengths greater than two micrometers, and in some embodiments, up to 5 micrometers, or more. The laser sustained plasma (LSP) light source (a.k.a., laser driven plasma source) produces photons across the entire wavelength range from 120 nanometers to approximately 2000 nanometers. The pump laser of the LSP light source may be continuous wave or pulsed. In some embodiments, combined illumination source 110 includes a supercontinuum laser source and an arc lamp, such as a Xenon arc lamp. However, a laser-driven plasma source produces significantly more photons than a Xenon lamp across the entire wavelength range from 120 nanometers to 2000 nanometers, and is therefore preferred.

In general, combined illumination source 110 includes a combination of a plurality of broadband or discrete wavelength light sources. The light generated by combined illumination source 110 includes a continuous spectrum or parts of a continuous spectrum, from ultraviolet to infrared (e.g., vacuum ultraviolet to long infrared). In general, combined illumination light source 110 may include a supercontinuum laser source, an infrared helium-neon laser source, a silicon carbide globar light source, a tungsten halogen light source, one or more infrared LEDs, one or more infrared lasers or any other suitable infrared light source generating wavelengths greater than two micrometers, and an arc lamp (e.g., a Xenon arc lamp), a deuterium lamp, a LSP light source, or any other suitable light source generating wavelengths less than two micrometers including visible and ultraviolet wavelengths.

In general, combined illumination source 110 includes multiple illumination sources optically coupled in any suitable manner. In some embodiments, light emitted by a supercontinuum laser source is directly coupled through the plasma generated by the ultraviolet/visible light source.

Figure 6:
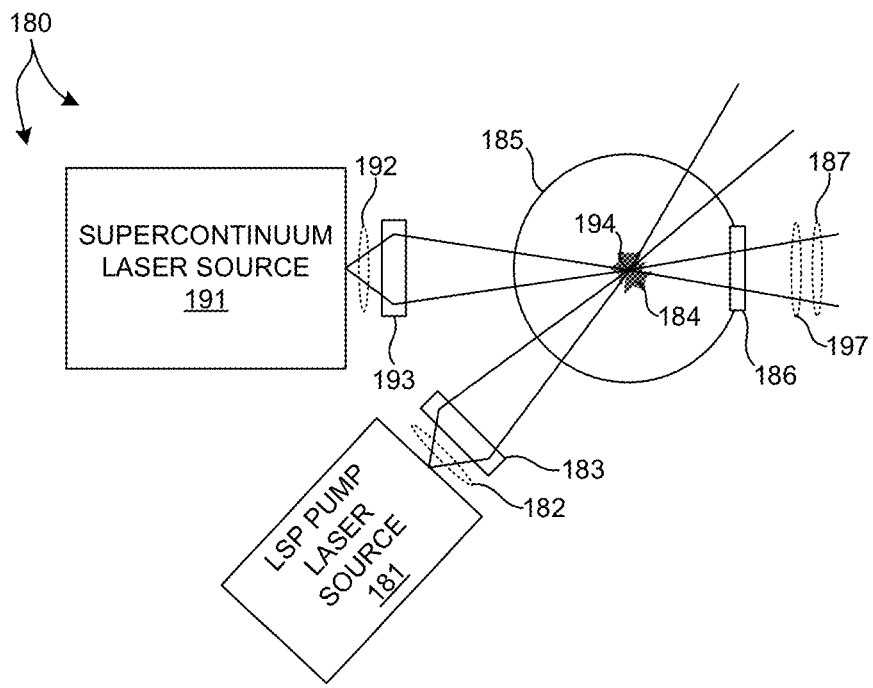
FIG. 6 depicts an embodiment 180 of a combined illumination source.

FIG. 6 depicts an embodiment 180 of a combined illumination source 110. As depicted in FIG. 6, a LSP pump laser source 181 generates pump light 182 that is focused by focusing optics 183 to sustain a plasma 184 contained by bulb 185. Plasma 184 generates broadband spectrum light over a wavelength range of ultra-violet to short infrared. Bulb 185 includes an exit port 186. LSP output light 187 is the portion of light from plasma 184 that passes through exit port 186 and is directed towards the illumination optics subsystem as described with reference to FIG. 5. In addition, supercontinuum laser source 191 generates infrared light 192 that is focused by focusing optics 193 to a focus 194 at or near plasma 184. Supercontinuum output light 197 is the portion of light from the focus 194 that passes through exit port 186 and is directed towards the illumination subsystem as described with reference to FIG. 5. In one example, the LSP output light 187 and supercontinuum output light 197 are collocated. In this manner, infrared light 197 from supercontinuum source 191 is effectively combined with ultraviolet/visible light 187 from LSP laser source 181. In one example, LSP output light 187 and supercontinuum output light 197 have the same or similar numerical aperture. In another example, LSP output light 187 and supercontinuum output light 197 have different numerical aperture. In some examples, bulb 185 is constructed from Calcium Fluoride or Magnesium Fluoride to transmit wavelengths above 2.5 micrometers generated by supercontinuum laser source 191. In some other examples, bulb 185 includes one or more exit ports 186 fabricated from Calcium Fluoride or Magnesium Fluoride to transmit wavelengths above 2.5 micrometers generated by supercontinuum laser source 191. A conventional bulb constructed from fused silica does not transmit significant light above 2.5 micrometers, and is thus unsuitable for combining light generated by the supercontinuum laser source 191 in the manner described herein. In some embodiments, the LSP pump laser source 181 is a continuous wave laser. In some other embodiments, the LSP pump laser source 181 is a pulsed laser.

Figure 7A:
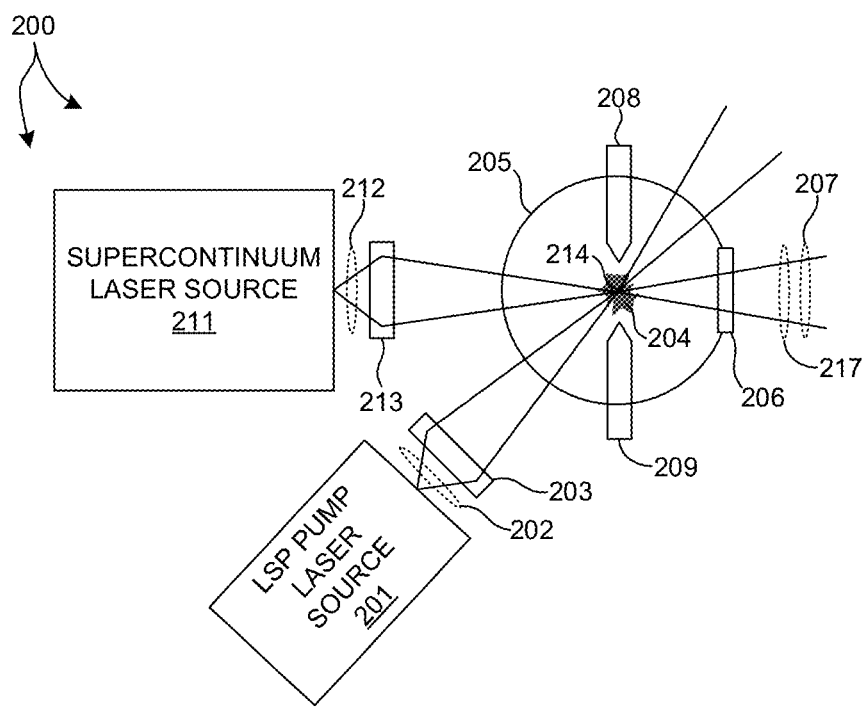
FIG. 7A depicts another embodiment 200 of a combined illumination source.

FIG. 7A depicts an embodiment 200 of a combined illumination source 110. As depicted in FIG. 7, a voltage provided across a cathode 208 and an anode 209 generates a plasma 204 contained by bulb 205. In addition, a LSP pump laser source 201 generates pump light 202 that is focused by focusing optics 203 to sustain a plasma 204 contained by bulb 205. Plasma 204 generates broadband spectrum light over a wavelength range of ultra-violet to short infrared. Ultraviolet/visible/short infrared light 207 generated by plasma 204 is provided to the illumination optics subsystem as described with reference to FIG. 5. In addition, supercontinuum laser source 211 generates infrared light 212. Infrared light 212 is focused by focusing lens 213 and forms a focus 214 at or near plasma 204. Infrared light 217 from focus 214 is provided to the illumination optics subsystem as described with reference to FIG. 5. In one example, UV/visible/short infrared light 207 and infrared light 217 are collocated and are effectively combined. In some examples, bulb 205 is constructed from Calcium Fluoride or Magnesium Fluoride to transmit wavelengths above 2.5 micrometers generated by supercontinuum laser source 211. In some other examples, bulb 205 includes one or more exit ports 206 fabricated from Calcium Fluoride or Magnesium Fluoride to transmit wavelengths above 2.5 micrometers generated by supercontinuum laser source 211. A conventional bulb constructed from fused silica does not transmit significant light above 2.5 micrometers, and is thus unsuitable for combining light generated by the supercontinuum laser illumination source 211 in the manner described herein.

Figure 7B:
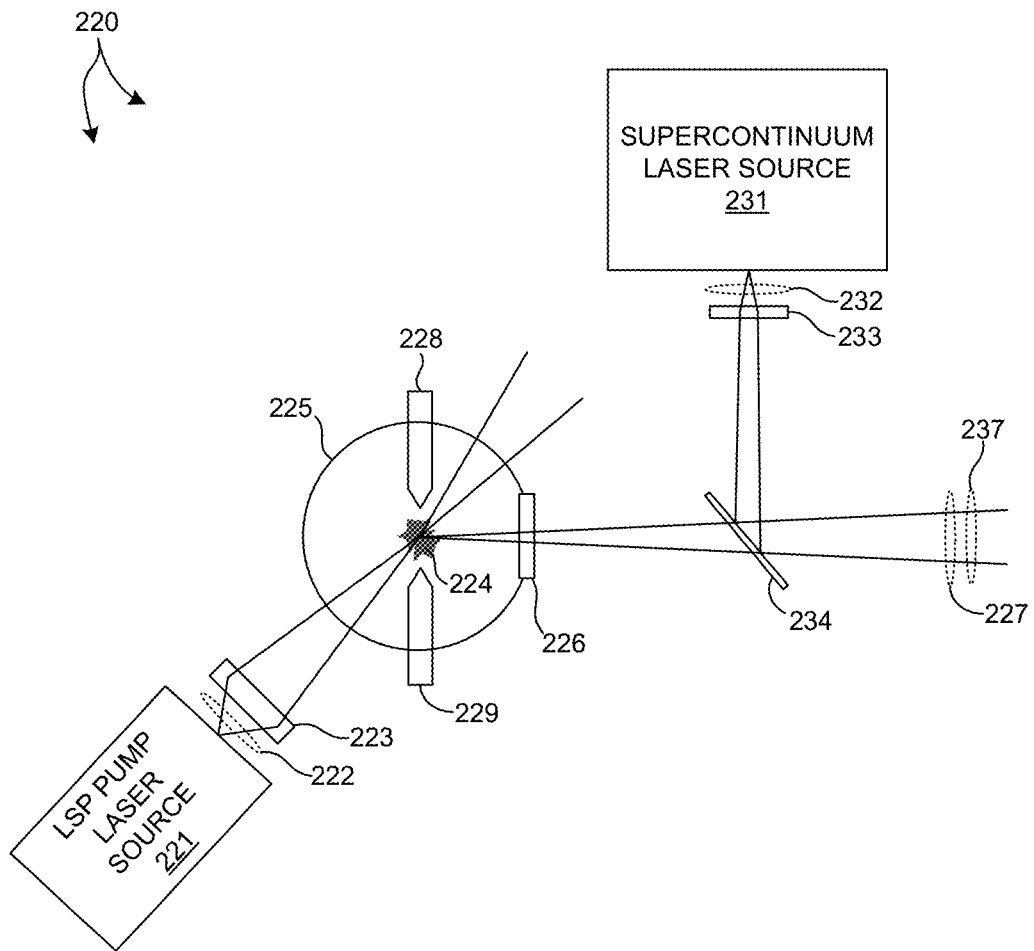
FIG. 7B depicts another embodiment 220 of a combined illumination source.

FIG. 7B depicts an embodiment 220 of a combined illumination source 110. As depicted in FIG. 7B, a voltage provided across a cathode 228 and an anode 229 generates a plasma 224 contained by bulb 225. In addition, a LSP pump laser source 221 generates pump light 222 that is focused by focusing optics 223 to sustain plasma 224 contained by bulb 225. Plasma 224 generates broadband spectrum light over a wavelength range of ultra-violet to short infrared. Ultraviolet/visible/short infrared light 227 generated by plasma 224 exits bulb 225 through exit port 226 and is provided to the illumination optics subsystem as described with reference to FIG. 5. In addition, supercontinuum laser source 231 generates infrared light 232. Infrared light 232 is focused by focusing lens 233. Infrared light 237 from supercontinuum laser source 231 is provided to the illumination optics subsystem as described with reference to FIG. 5.

As depicted in FIG. 7B, UV/visible/short infrared light 227 and infrared light 237 are combined by beam combiner 234. As such, beam combiner 234 combines light generated by an ultraviolet light source 221 (e.g., LSP light source 221) with light generated by an infrared light source 231 (e.g., supercontinuum laser light source 231). In one example, the beam combiner 234 has a splitting wavelength, for example, at or near 900 nanometers. The beam combiner minimizes loss of light generated by the LSP light source (LSP loss less than 10%) and minimizes depolarization effects (e.g., less than 0.1%) across all illumination wavelengths.

Figure 7C:
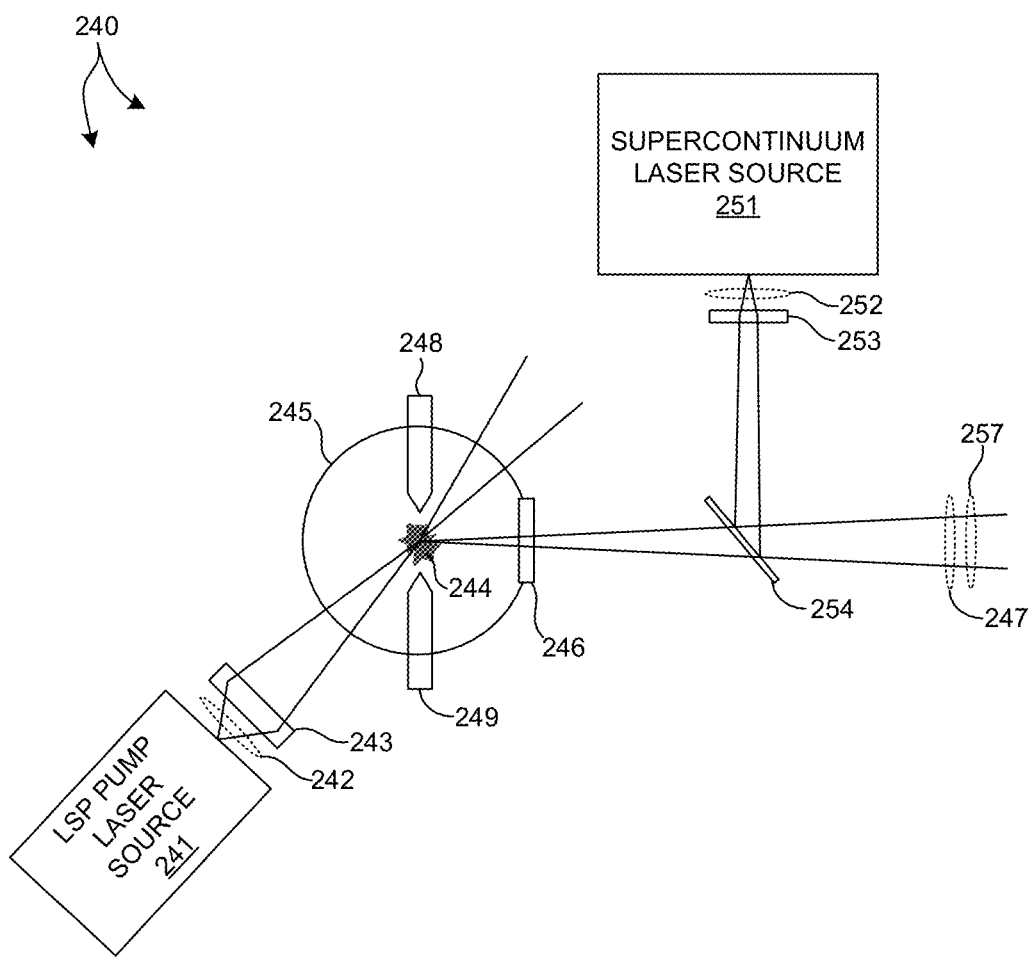
FIG. 7C depicts another embodiment 240 of a combined illumination source.

FIG. 7C depicts an embodiment 240 of a combined illumination source 110. As depicted in FIG. 7B, a voltage provided across a cathode 248 and an anode 249 generates a plasma 244 contained by bulb 245. In addition, a LSP pump laser source 241 generates pump light 242 that is focused by focusing optics 243 to sustain plasma 244 contained by bulb 245. Plasma 244 generates broadband spectrum light over a wavelength range of ultra-violet to short infrared. Ultraviolet/visible/short infrared light 247 generated by plasma 244 exits bulb 245 through exit port 246 and is provided to the illumination optics subsystem as described with reference to FIG. 5. In addition, supercontinuum laser source 251 generates infrared light 252. Infrared light 252 is focused by focusing lens 253. Infrared light 257 from supercontinuum laser source 251 is provided to the illumination optics subsystem as described with reference to FIG. 5.

As depicted in FIG. 7C combined illumination source 110 provides ultraviolet and infrared illumination light to wafer 120 selectively. In these examples, the measurement is time multiplexed. Mirror 254 is a moveable mirror. In one example, moveable mirror 254 is mounted to a galvanometer is employed to selectively direct ultraviolet/visible light 247 and infrared light 257 to wafer 120 based on whether moveable mirror 254 is locating in or out of the optical path of ultraviolet/visible light 247. In another example, a moveable total internal reflection prism is employed to selectively direct ultraviolet/visible light 247 and infrared light 257 to wafer 120. In this manner, spectral measurements including ultraviolet/visible spectra are performed at a different time than spectral measurements including infrared spectra.

In general, the broadband illumination light includes wavelengths between 120 nanometers and 3,000 nanometers, and beyond 3,000 nanometers. In some examples, broadband illumination light includes wavelengths up to 5,000 nanometers.

As depicted in FIG. 5, metrology system 100 includes an illumination subsystem configured to direct illumination light 117 to one or more structures formed on the wafer 120. The illumination subsystem is shown to include combined light source 110, one or more optical filters 111, polarizing component 112, field stop 113, aperture stop 114, and illumination optics 115. The one or more optical filters 111 are used to control light level, spectral output, or both, from the illumination subsystem. In some examples, one or more multi-zone filters are employed as optical filters 111. Polarizing component 112 generates the desired polarization state exiting the illumination subsystem. In some embodiments, the polarizing component is a polarizer, a compensator, or both, and may include any suitable commercially available polarizing component. The polarizing component can be fixed or rotatable to different fixed positions. Although the illumination subsystem depicted in FIG. 5 includes one polarizing component, the illumination subsystem may include more than one polarizing component. Field stop 113 controls the field of view (FOV) of the illumination subsystem and may include any suitable commercially available field stop. Aperture stop 114 controls the numerical aperture (NA) of the illumination subsystem and may include any suitable commercially available aperture stop. Light from combined illumination source 110 is directed through illumination optics 115 to be focused on one or more structures (not shown in FIG. 5) on wafer 120. The illumination subsystem may include any type and arrangement of optical filter(s) 111, polarizing component 112, field stop 113, aperture stop 114, and illumination optics 115 known in the art of spectroscopic metrology.

As depicted, in FIG. 5, the beam of illumination light 117 passes through optical filter(s) 111, polarizing component 112, field stop 113, aperture stop 114, and illumination optics 115 as the beam propagates from the illumination source 110 to wafer 120. Beam 117 illuminates a portion of wafer 120 over a measurement spot 116.

In some examples, the beam size of the amount of illumination light 117 projected onto the surface of wafer 120 is smaller than a size of a measurement target that is measured on the surface of the specimen. Exemplary beam shaping techniques are described in detail in U.S. Patent Application Publication No. 2013/0114085 by Wang et al., the contents of which are incorporated herein by reference in their entirety.

In some examples, noise and polarization optimization are performed to improve the performance of combined illumination source 110. In some examples, depolarization is achieved by use of multimode fibers, a Hanle depolarizer, or an integration sphere. In some examples, the illumination source etendue is optimized by use of light guides, fibers, and other optical elements (e.g., lenses, curved mirrors, apodizers, etc.). In some examples, source coherence or coherence effects are mitigated by coherence breaking techniques, or are otherwise accounted for by modeling and simulation.

Metrology system 100 also includes a collection optics subsystem configured to collect light generated by the interaction between the one or more structures and the incident illumination beam 117. A beam of collected light 127 is collected from measurement spot 116 by collection optics 122. Collected light 127 passes through collection aperture stop 123, polarizing element 124 and field stop 125 of the collection optics subsystem.

Collection optics 122 includes any suitable optical elements to collect light from the one or more structures formed on wafer 120. Collection aperture stop 123 controls the NA of the collection optics subsystem. Polarizing element 124 analyzes the desired polarization state. The polarizing element 124 is an analyzer or a compensator. The polarizing element 124 can be fixed or rotatable to different fixed positions. Although the collection subsystem depicted in FIG. 5 includes one polarizing element, the collection subsystem may include more than one polarizing element. Collection field stop 125 controls the FOV of the collection subsystem. The collection subsystem takes light from wafer 120 and directs the light through collection optics 122 and polarizing element 124 to be focused on collection field stop 125. In some embodiments, collection field stop 125 is used as a spectrometer slit for the spectrometers of the detection subsystem. However, collection field stop 125 may be located at or near a spectrometer slit 126 of the spectrometers of the detection subsystem.

The collection subsystem may include any type and arrangement of collection optics 122, aperture stop 123, polarizing element 124, and field stop 125 known in the art of spectroscopic reflectometry.

In the embodiment depicted in FIG. 5, the collection optics subsystem directs light to more than one spectrometer of the detection subsystem. The detection subsystem generates output responsive to light collected from the one or more structures illuminated by the illumination subsystem.

In one aspect, the detector subsystem includes two or more detectors each configured to detect collected light over different wavelength ranges, including infrared, simultaneously.

In the embodiment depicted in FIG. 5, collected light 127 passes through spectrometer slit 126 and is incident on diffractive element 128. Diffractive element 128 is configured to diffract a subset of wavelengths of the incident light into the +/−1 diffraction order and diffract a different subset of wavelengths of the incident light into the zero diffraction order. As depicted in FIG. 5, portion 129 of the incident light including the ultraviolet spectrum is dispersed at the +/−1 diffraction order toward detector 141 by diffractive element 128. In addition, diffractive element 128 is configured to reflect portion 140 of the incident light including infrared wavelengths at the zero diffraction order toward grating 147. Light 140 is incident on diffractive element 147 and diffractive element 147 disperses portion 148 of the incident light 140 including infrared wavelengths at the +/−1 diffraction order toward detector 150.

In the embodiment depicted in FIG. 5, diffractive element 128 is a reflective grating element. However, in general, diffractive element 128 may be configured to subdivide the incident light into different wavelength bands, propagate the different wavelength bands in different directions, and disperse the light of one of the wavelength bands onto a detector in any suitable manner. In one example, diffractive element 128 is configured as a transmissive grating. In some other examples, diffractive element 128 includes a beam-splitting element to subdivide the beam into different wavelength bands and a reflective or transmissive grating structure to disperse one of the wavelength bands onto detector 141.

Reflective grating 128 is employed because it exhibits high diffraction efficiency into the +/−1 orders in the ultraviolet spectral region and high diffraction efficiency into the zeroth diffraction order for the infrared spectral region. By employing a reflective grating, losses inherent to beam splitting elements (such as a dichroic beam splitting element) are avoided.

The diffractive elements 128 and 147 linearly disperse first order diffracted light according to wavelength along one dimension of each respective two dimensional detector (i.e., the wavelength dispersion direction noted in FIG. 5 for each respective detector). For purposes of illustration, light detected at two different wavelengths is illustrated on the surface of detector 141. Diffractive element 128 causes a spatial separation between the two different wavelengths of light projected onto the surface of detector 141. In this manner, light collected from measurement spot 116 having a particular wavelength is projected onto detector 141 over spot 142A and light collected from measurement spot 116 having another, different wavelength is projected onto detector 141 over spot 142B.

In one example, detector 141 is a charge coupled device (CCD) sensitive to ultraviolet and visible light (e.g., light having wavelengths between 190 nanometers and 860 nanometers). In one example, detector 150 is a photo detector array (PDA) sensitive to infrared light (e.g., light having wavelengths between 950 nanometers and 5000 nanometers). However, in general, other two dimensional detector technologies may be contemplated (e.g., a position sensitive detector (PSD), an infrared detector, a photovoltaic detector, etc.). Each detector converts the incident light into electrical signals indicative of the spectral intensity of the incident light. For example, UV detector 141 generates output signals 154A indicative of incident light 129 and IR detector 150 generates output signals 154B indicative of incident light 148.

As depicted in FIG. 5, the detection subsystem is arranged such that the collected light propagates to all detectors of metrology system 100, simultaneously. Metrology system 100 also includes computing system 130 configured to receive detected signals 154, including both UV and IR signals, and determines an estimate 155 of a value of a parameter of interest of the measured structure(s) based on both the UV and IR signals. By simultaneously collecting UV and IR spectra measurement times are reduced and all spectra are measured with the same alignment conditions. This allows wavelength errors to be corrected more easily because a common correction can be applied to all spectral data sets.

Figure 8:
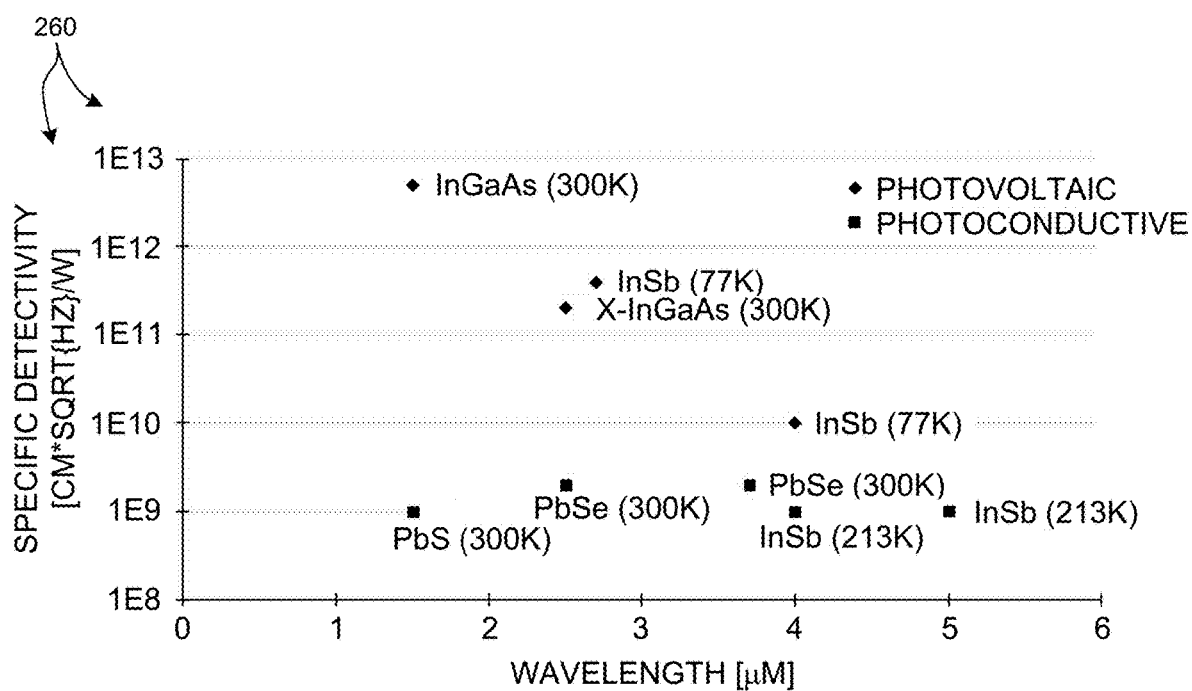
FIG. 8 depicts a plot illustrative of the specific detectivity of various detector technologies operating at specified temperatures.

FIG. 8 depicts a plot 260 illustrative of the specific detectivity of various detector technologies operating at specified temperatures. As illustrated in FIG. 8, both photovoltaic and photoconductive detector technologies are suitable for detecting radiation at infrared wavelengths exceeding one micrometer, and up to five micrometers. In some examples, metrology system 100 include detectors such as lead sulfide (PbS), lead selenide (PbSe), indium antimonide (InSb), indium arsenide (InAs), mercury cadmium telluride (HgCdTe), indium gallium arsenide (In-GaAs), x-InGaAs, pyroelectric, and bolometric detectors.

Pyroelectric and bolometric detectors are not quantum detectors. Thus, these detectors may accept high light levels without saturation, and thus reduce noise sensitivity.

In some embodiments, the detector subsystem is shot noise limited, rather than dark noise limited. In these examples, it is preferred to perform multiple measurements at high light levels to reduce measurement system noise.

In some embodiments, a time dependent measurement (e.g., pulsed light source, chopper, etc.) is performed in coordination with a lock-in amplifier or other phase locked loop to increase the measurement signal to noise ratio.

In some embodiments, one or more of the detectors are cooled to temperatures of −20° C., 210° K, 77° K, or other low temperature to reduce measurement noise. In general, any suitable cooling element may be employed to maintain the temperature of a detector at a constant temperature during operation. By way of non-limiting example, any of a multi stage Peltier cooler, rotating disc cooler, Stirling cycle cooler, N2 cooler, He cooler, etc. may be contemplated within the scope of this patent document.

In a further aspect, the spectroscopic measurements are performed off-axis from the direction normal to the surface of the wafer to reduce the influence of backside reflections on the measurement results.

In another aspect, one or more of the infrared spectroscopic reflectometers described herein employ off-axis illumination, collection, or both, to reject measurement signals generated by reflections from the bottom of the underlying substrate.

Figure 9:
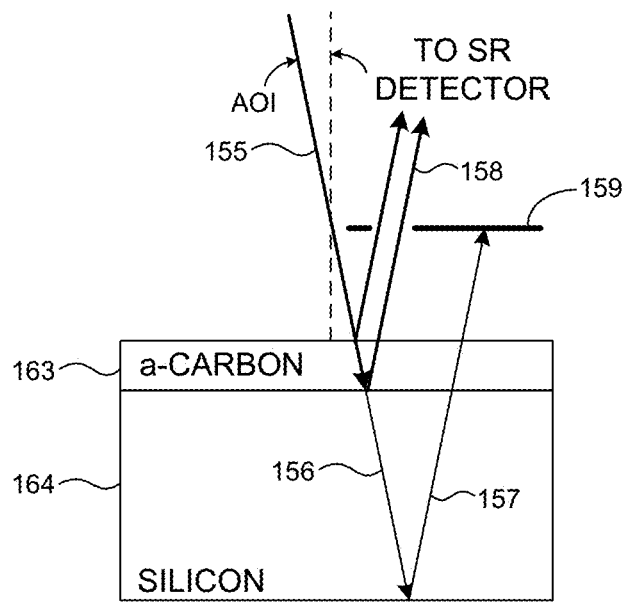
FIG. 9 depicts illumination incident onto a film layer disposed on a substrate at near normal incidence, but specifically avoiding normal incidence.

FIG. 9 depicts illumination 155 incident onto film layer 163, which is disposed on substrate 164. As depicted in FIG. 9, the illumination is arranged at near normal incidence, but specifically avoiding normal incidence (AOI=zero degrees). A portion of incident light reflects from the surface of film 163, another portion 158 reflects from the interface between film 163 and substrate 164. These reflections are desirable and must be collected to estimate the thickness of film 163 based on a reflectometry technique. However, in addition, a portion 156 of the incident light 155 penetrates the substrate 164. A portion 157 of light 156 reflects from the bottom of the substrate (e.g., the backside of a wafer), propagates through substrate 164 and film 163. Light 157 is undesirable and contaminates the measurement of film 163. As depicted in FIG. 9, a collection aperture 159 is successfully employed to block the undesirable light 157 reflected from the back surface of the substrate 164. This is possible because the non-zero angle of incidence of the illumination creates a spatial separation between light reflected from the top and bottom surfaces of film 163 and light 157 reflected from the bottom of substrate 164.

Figure 10:
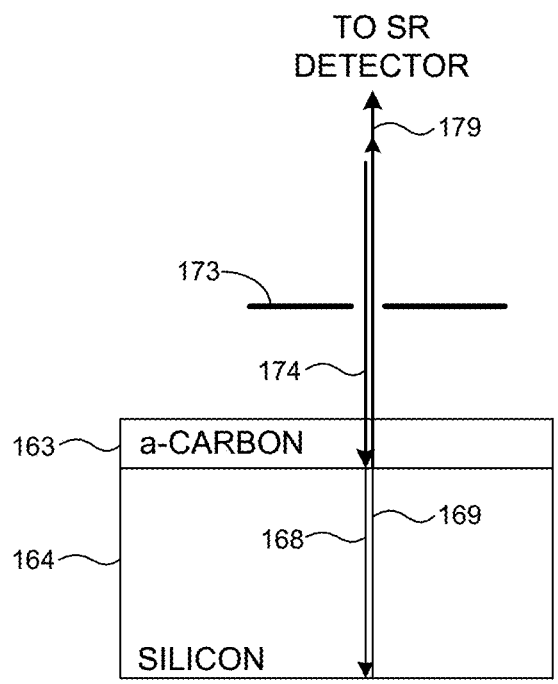
FIG. 10 depicts illumination incident onto a film layer disposed on a substrate at normal incidence.

In contrast, FIG. 10 depicts illumination 174 incident onto film layer 163, which is disposed on substrate 164. As depicted in FIG. 10, the illumination is arranged at normal incidence. A portion of incident light 174 reflects from the surface of film 163, another portion reflects from the interface between film 163 and substrate 164. In addition, a portion 168 of the incident light 174 penetrates the substrate 164. A portion 169 of light 168 reflects from the bottom of the substrate (e.g., the backside of a wafer), propagates through substrate 164 and film 163. Light 169 is undesirable and contaminates the measurement of film 163. As depicted in FIG. 10, a collection aperture 173 is unable to block the undesirable light 169 reflected from the back surface of the substrate 164 because the zero angle of incidence of the illumination does not generate spatial separation between light reflected from the top and bottom surfaces of film 164 and light 169 reflected from the bottom of substrate 164.

Thus, in some embodiments, it is preferable to perform infrared reflectrometry measurements as described herein at non-zero angles of incidence. In this manner, light generated from backside reflections can be effectively blocked from the measurement.

In another further aspect, a broad range of wavelengths are detected by a detector that includes multiple photosensitive areas having different sensitivity characteristics. Collected light is linearly dispersed across the surface of the detector according to wavelength. Each different photosensitive area is arranged on the detector to sense a different range of incident wavelengths. In this manner, a broad range of wavelengths are detected with high signal to noise ratio by a single detector. These features, individually, or in combination, enable high throughput measurements of high aspect ratio structures (e.g., structures having depths of one micrometer or more) with high throughput, precision, and accuracy.

In some embodiments, a detector subsystem includes a multi-zone infrared detector that combines different sensitivity bands at different locations on a single detector package. The detector is configured to deliver a continuous spectrum of data at different sensitivities, depending on location of incidence.

Figure 12:
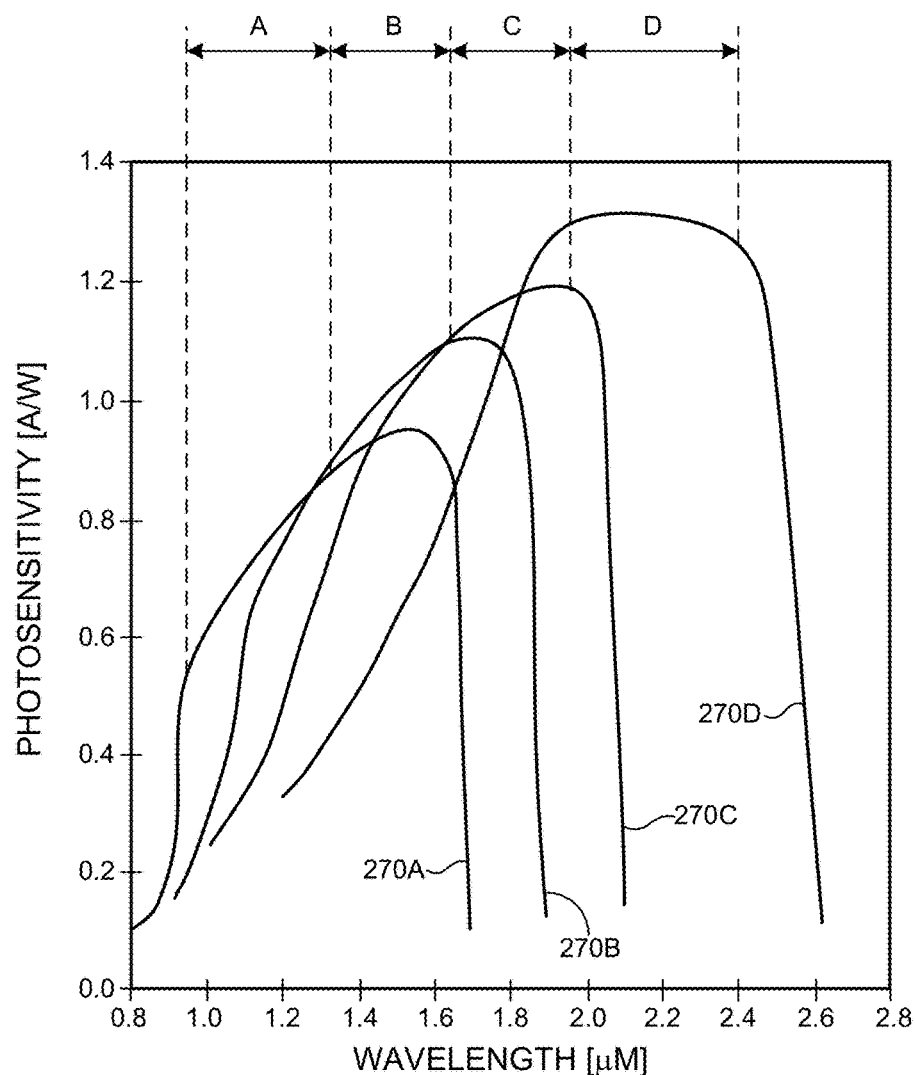
FIG. 12 illustrates typical photosensitivity curves of four available Indium Gallium Arsenide (InGaAs) sensors.

FIG. 12 illustrates typical photosensitivity curves of available Indium Gallium Arsenide (InGaAs) sensors. As depicted in FIG. 12, no single sensor of the available InGaAs sensors is capable of providing adequate photosensitivity across a wavelength band from 1 micrometer to 2.5 micrometers. Thus, individually, the available sensors are only capable of sensing over a narrow waveband.

In one aspect, multiple sensor chips, each sensitive in a different waveband are combined into a single detector package. In turn, this multi-zone detector is implemented in the metrology systems described herein.

Figure 11:
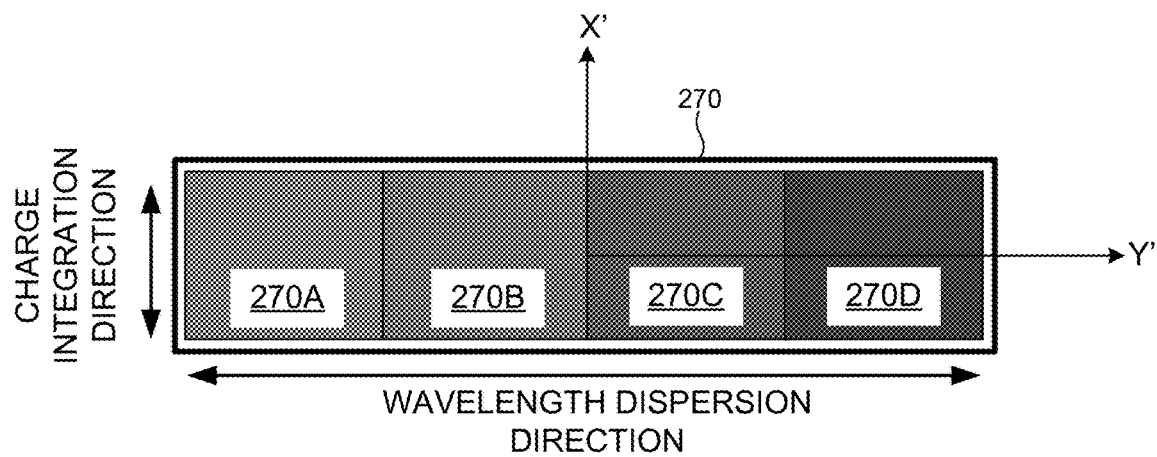
FIG. 11 depicts an illustration of a multi-zone infrared detector 270.

FIG. 11 depicts four sensor chips 270A-D derived from four different wavebands to make a multi-zone infrared detector 180. The four sensor chips include different material compositions that each exhibit different photosensitivity characteristics. As depicted in FIG. 11, sensor chip 270A exhibits high sensitivity over a waveband, A, sensor chip 270B exhibits high sensitivity over a waveband, B, sensor chip 270C exhibits high sensitivity over a waveband, C, and sensor chip 270D exhibits high sensitivity over a waveband, D. A metrology system incorporating detector 270 is configured to disperse wavelengths within waveband A onto sensor chip 270A, disperse wavelengths within waveband B onto sensor chip 270B, disperse wavelengths within waveband C onto sensor chip 270C, and disperse wavelengths within waveband D onto sensor chip 270D. In this manner, high photosensitivity (i.e., high SNR) is achieved over the aggregate waveband that includes wavebands A-D from a single detector. As a result measurement noise over the entire measurement range is reduced by limiting the use of a particular sensor to a narrowband where measurement sensitivity is high and measurement noise is low.

In some examples, a multi-zone detector includes InGaAs sensors with sensitivity to different spectral regions assembled in a single sensor package to produce a single, contiguous spectrum covering wavelengths from 750 nanometers to 3,000 nanometers, or beyond.

In general, any number of individual sensors may be assembled along the direction of wavelength dispersion of the multi-zone detector such that a contiguous spectrum maybe derived from the detector. However, typically, two to four individual sensors are employed in a multi-zone detector, such as detector 270.

In one embodiment, three individual sensors are employed with the first segment spanning the range between 800 nanometers and 1600 nanometers, the second segment spanning the range between 1600 nanometers and 2200 nanometers, and the third segment spanning the range between 2200 nanometers and 2600 nanometers.

Although, the use of InGaAs based infrared detectors is specifically described herein, in general, any suitable material that exhibits narrow sensitivity ranges and sharp sensitivity cutoffs may be integrated into a multi-zone detector as described herein.

As depicted in FIG. 5, the illustrated measurement channel includes a polarizer on the illumination side and an analyzer on the collection side. However, in general, it is contemplated that any measurement channel may include, or not include, an illumination polarizer, a collection analyzer, an illumination compensator, a collection compensator, in any combination, to perform measurements of the polarized reflectivity of the sample, unpolarized reflectivity of the sample, or both.

In some embodiments, one or more measurement channels of the metrology system are configured to measure the wafer at different azimuth angles, in addition to different ranges of wavelength and angle of incidence. In some embodiments, a metrology system including an infrared spectrometer as described herein is configured to perform measurements of the wafer at azimuth angles of zero and ninety degrees relative to the metrology target. In some embodiments, the metrology system is configured to measure wafer reflectivity over one or more wavelength ranges, one or more AOI ranges, and one or more azimuth angles simultaneously. In some embodiments, a metrology system utilizes one or more combined LSP & supercontinuum sources in one or more spectroscopic ellipsometers, spectroscopic reflectometers, discreet wavelength ellipsometers, rotating polarizer ellipxometers, rotating compensator ellipsometers, rotating polarizer rotating compensator ellipsometetrs and Mueller-matrix ellipsometers.

In another further aspect, the dimensions of illumination field stop projected on wafer plane are adjusted to optimize the resulting measurement accuracy and speed based on the nature of target under measurement.

In another further aspect, the dimensions of illumination field stop are adjusted to achieve the desired spectral resolution for each measurement application.

In some examples, e.g., if the sample is a very thick film or grating structure, the illumination field stop projected on wafer plane in the direction perpendicular to the plane of incidence is adjusted to reduce the field size to achieve increase spectral resolution. In some examples, e.g., if the sample is a thin film, the illumination field stop projected on wafer plane in the direction perpendicular to the plane of incidence is adjusted to increase the field size to achieve a shortened measurement time without losing spectral resolution.

In the embodiment depicted in FIG. 5, computing system 130 is configured to receive signals 154 indicative of the spectral response detected by the detector subsystem. Computing system 130 is further configured to determine control signals 119 that are communicated to programmable illumination field stop 113. Programmable illumination field stop 113 receives control signals 119 and adjusts the size of the illumination aperture to achieve the desired illumination field size.

In some examples, the illumination field stop is adjusted to optimize measurement accuracy and speed as described hereinbefore. In another example, the illumination field stop is adjusted to prevent image clipping by the spectrometer slit and corresponding degradation of measurement results. In this manner, the illumination field size is adjusted such that the image of the measurement target underfills the spectrometer slit. In one example, the illumination field stop is adjusted such that the projection of the polarizer slit of the illumination optics underfills the spectrometer slit of the metrology system.

Figure 13:
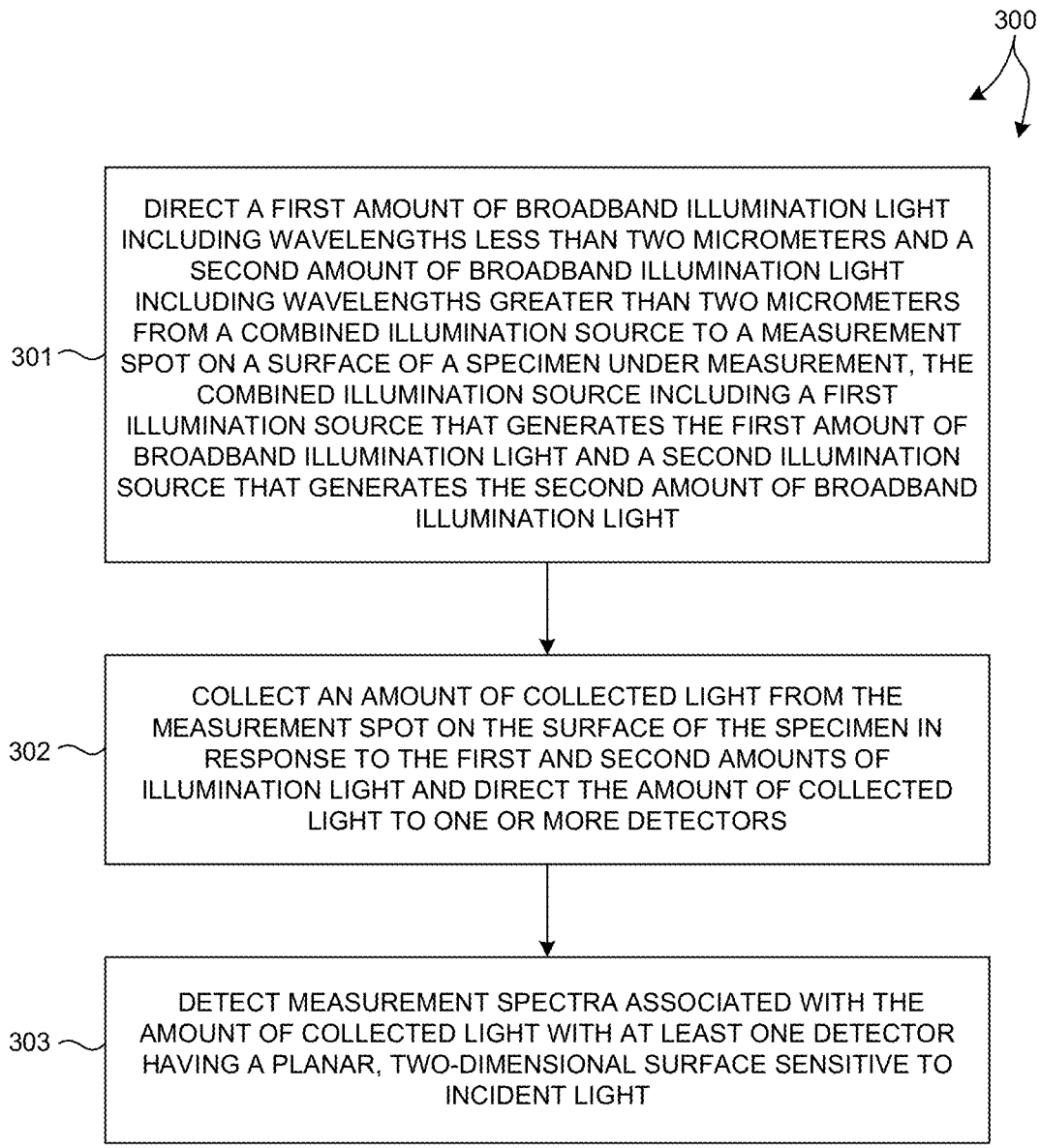
FIG. 13 illustrates a method 300 of performing spectroscopic measurements of one or more structures using a combined illumination source as described herein.

FIG. 13 illustrates a method 300 of performing spectroscopic measurements in at least one novel aspect. Method 300 is suitable for implementation by a metrology system such as metrology system 100 illustrated in FIG. 5 of the present invention. In one aspect, it is recognized that data processing blocks of method 300 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 301, a first amount of broadband illumination light including wavelengths less than two micrometers and a second amount of broadband illumination light including wavelengths greater than two micrometers from a combined illumination source is directed to a measurement spot on a surface of a specimen under measurement. The combined illumination source includes a first illumination source that generates the first amount of broadband illumination light and a second illumination source that generates the second amount of broadband illumination light.

In block 302, an amount of collected light is collected from the measurement spot on the surface of the specimen in response to the first and second amounts of illumination light and the amount of collected light is directed to one or more detectors.

In block 303, measurement spectra associated with the amount of collected light are detected with at least one detector having a planar, two-dimensional surface sensitive to incident light.

In a further embodiment, system 100 includes one or more computing systems 130 employed to perform measurements of actual device structures based on spectroscopic measurement data collected in accordance with the methods described herein. The one or more computing systems 130 may be communicatively coupled to the spectrometer. In one aspect, the one or more computing systems 130 are configured to receive measurement data associated with measurements of the structure of the specimen under measurement.

It should be recognized that one or more steps described throughout the present disclosure may be carried out by a single computer system 130 or, alternatively, a multiple computer system 130. Moreover, different subsystems of system 100 may include a computer system suitable for carrying out at least a portion of the steps described herein. Therefore, the aforementioned description should not be interpreted as a limitation on the present invention but merely an illustration.

In addition, the computer system 130 may be communicatively coupled to the spectrometers in any manner known in the art. For example, the one or more computing systems 130 may be coupled to computing systems associated with the spectrometers. In another example, the spectrometers may be controlled directly by a single computer system coupled to computer system 130.

The computer system 130 of metrology system 100 may be configured to receive and/or acquire data or information from the subsystems of the system (e.g., spectrometers and the like) by a transmission medium that may include wireline and/or wireless portions. In this manner, the transmission medium may serve as a data link between the computer system 130 and other subsystems of system 100.

Computer system 130 of metrology system 100 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board metrology system 100, external memory, or other external systems). For example, the computing system 130 may be configured to receive measurement data from a storage medium (i.e., memory 132 or an external memory) via a data link. For instance, spectral results obtained using the spectrometers described herein may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a measurement model or an estimated parameter value 171 determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In some examples, the measurement models are implemented as an element of a SpectraShape® optical critical-dimension metrology system available from KLA-Tencor Corporation, Milpitas, Calif., USA. In this manner, the model is created and ready for use immediately after the spectra are collected by the system.

In some other examples, the measurement models are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

In another aspect, the methods and systems for spectroscopic metrology of semiconductor devices described herein are applied to the measurement of high aspect ratio (HAR) structures, large lateral dimension structures, or both. The described embodiments enable optical critical dimension (CD), film, and composition metrology for semiconductor devices including three dimensional NAND structures, such as vertical-NAND (V-NAND) structures, dynamic random access memory structures (DRAM), etc., manufactured by various semiconductor manufacturers such as Samsung Inc. (South Korea), SK Hynix Inc. (South Korea), Toshiba Corporation (Japan), and Micron Technology, Inc. (United States), etc. These complex devices suffer from low light penetration into the structure(s) being measured. FIG. 14 depicts an exemplary high aspect ratio NAND structure 400 that suffers from low light penetration into the structure(s) being measured. A spectroscopic ellipsometer with broadband capability and wide ranges of AOI, azimuth angle, or both, having simultaneous spectral band detection as described herein is suitable for measurements of these high-aspect ratio structures. HAR structures often include hard mask layers to facilitate etch processes for HARs. As described herein, the term "HAR structure" refers to any structure characterized by an aspect ratio that exceeds 2:1 or 10:1, and may be as high as 100:1, or higher.

In yet another aspect, the measurement results described herein can be used to provide active feedback to a process tool (e.g., lithography tool, etch tool, deposition tool, etc.). For example, values of measured parameters determined based on measurement methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values and a trained measurement model may be communicated to a lithography tool, etch tool, or deposition tool.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous SiO2. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A spectroscopic metrology system comprising:
a combined illumination source including a first illumination source configured to generate a first amount of illumination light including wavelengths less than two micrometers and a second illumination source configured to generate a second amount of illumination light including wavelengths greater than two micrometers;
an illumination optics subsystem including one or more optical elements in an optical path of the first and second amounts of illumination light, the first and second amounts of illumination light directed from the combined illumination source to a measurement spot on a surface of a specimen under measurement at one or more angles of incidence, one or more azimuth angles, or a combination thereof by the one or more optical elements;
a collection optics subsystem including one or more optical elements in an optical path of an amount of collected light from the measurement spot on the surface of the specimen;
at least one detector having a planar, two-dimensional surface sensitive to incident light, wherein the at least one detector includes two or more different surface areas each having different photosensitivity, wherein the two or more different surface areas are aligned with a direction of wavelength dispersion across the surface of the at least one detector, the at least one detector configured to detect the incident light and generate output indicative of the detected incident light; and
a computing system including one or more processors that generate an estimated value of a parameter of interest of the specimen under measurement based on an analysis of the output of the at least one detector.

2. The metrology system of claim 1, wherein the first illumination source is a laser sustained plasma (LSP) illumination source and the second illumination source is a supercontinuum laser illumination source.

3. The metrology system of claim 1, wherein the at least one detector includes two or more detectors configured in a cascaded arrangement, wherein each of the two or more detectors detects a portion of the amount of collected light over different spectral ranges.

4. The metrology system of claim 1, further comprising:
a cooling system that maintains the at least one detector at a constant temperature during operation.

5. The metrology system of claim 1, wherein the first illumination source is a laser sustained plasma (LSP) light source or an arc lamp light source.

6. The metrology system of claim 5, wherein at least a portion of the second amount of illumination light is transmitted through a plasma of the LSP light source or the arc lamp light source.

7. The metrology system of claim 5, wherein a plasma bulb contains the plasma generated by the LSP light source or the arc lamp light source, and wherein the plasma bulb is fabricated at least in part from Calcium Fluoride or Magnesium Fluoride.

8. The metrology system of claim 1, wherein the first and second amounts of illumination light are provided to the specimen simultaneously.

9. The metrology system of claim 1, wherein the first and second amounts of illumination light are provided to the specimen at different times.

10. The metrology system of claim 1, wherein the at least one detector includes an indium antimonide detector.

11. The metrology system of claim 1, wherein the specimen under measurement includes a three dimensional NAND structure or a dynamic random access memory structure.

12. A method comprising:
directing a first amount of broadband illumination light including wavelengths less than two micrometers and a second amount of broadband illumination light including wavelengths greater than two micrometers from a combined illumination source to a measurement spot on a surface of a specimen under measurement, the combined illumination source including a first illumination source that generates the first amount of broadband illumination light and a second illumination source that generates the second amount of broadband illumination light;
collecting an amount of collected light from the measurement spot on the surface of the specimen in response to the first and second amounts of illumination light and directing the amount of collected light to one or more detectors; and
detecting measurement spectra associated with the amount of collected light with at least one detector having a planar, two-dimensional surface sensitive to incident light.

13. The method of claim 12, wherein the first illumination source is a laser sustained plasma (LSP) illumination source and the second illumination source is a supercontinuum laser illumination source.

14. The method of claim 12, wherein the at least one detector includes two or more detectors configured in a cascaded arrangement, wherein each of the two or more detectors detects a portion of the amount of collected light over different spectral ranges.

15. The method of claim 12, wherein the at least one detector includes two or more different surface areas each having different photosensitivity, wherein the two or more different surface areas are aligned with a direction of wavelength dispersion across the surface of the at least one detector.

16. The method of claim 12, further comprising:
maintaining the at least one detector at a constant temperature during operation.

17. The method of claim 12, wherein the first illumination source is a laser sustained plasma (LSP) light source or an arc lamp light source, and wherein at least a portion of the second amount of illumination light is transmitted through a plasma of the LSP light source or the arc lamp light source.

18. The method of claim 12, wherein the first and second amounts of illumination light are provided to the specimen simultaneously.

19. The method of claim 12, wherein the first and second amounts of illumination light are provided to the specimen at different times.

20. A metrology system comprising:
a combined illumination source including a plasma based illumination source configured to generate a first amount of illumination light including wavelengths less than two micrometers and a second illumination source configured to generate a second amount of illumination light including wavelengths greater than two micrometers, wherein at least a portion of the second amount of illumination light is transmitted through a plasma of the plasma based illumination source;

one or more optical elements in an optical path of the first and second amounts of illumination light, the first and second amounts of illumination light directed from the combined illumination source to a measurement spot on a surface of a specimen by the one or more optical elements;

at least one detector that detects the amount of light collected from the measurement spot in response to the first and second amounts of illumination light incident on the specimen at the measurement spot and generates output indicative of the detected light; and a computing system including one or more processors that generate an estimated value of a parameter of interest of the specimen under measurement based on an analysis of the output of the at least one detector.

21. The combined illumination source of claim 20, wherein the plasma based illumination source is a laser sustained plasma (LSP) illumination source.

22. The combined illumination source of claim 20, wherein the second illumination source is a supercontinuum laser illumination source.

* * * * *